(12) United States Patent
Jiang

(10) Patent No.: US 7,668,698 B2
(45) Date of Patent: Feb. 23, 2010

(54) DUTY CYCLE CALIBRATION FOR RECEIVER CLOCK

(75) Inventor: Yueming Jiang, Rancho Cordova, CA (US)

(73) Assignee: Intel Corporation, Santa Clara, CA (US)

( * ) Notice: Subject to any disclaimer, the term of this patent is extended or adjusted under 35 U.S.C. 154(b) by 10 days.

(21) Appl. No.: 11/951,699

(22) Filed: Dec. 6, 2007

(65) Prior Publication Data

US 2009/0146715 A1   Jun. 11, 2009

(51) Int. Cl.
*H04B 1/10* (2006.01)

(52) U.S. Cl. .................. 702/189; 702/79; 327/141; 327/175; 327/291; 330/258; 714/731; 375/295; 375/316; 375/377

(58) Field of Classification Search .................. 702/79, 702/189; 327/141, 155, 175, 291; 330/258; 714/731; 375/295, 316, 377
See application file for complete search history.

(56) References Cited

U.S. PATENT DOCUMENTS

| | | | | |
|---|---|---|---|---|
| 6,084,452 A | * | 7/2000 | Drost et al. | 327/175 |
| 7,202,722 B2 | * | 4/2007 | Mahadevan et al. | 327/175 |
| 2007/0266285 A1 | * | 11/2007 | Boerstler et al. | 714/731 |
| 2008/0013668 A1 | * | 1/2008 | Willis | 377/56 |

* cited by examiner

*Primary Examiner*—Edward Raymond
*Assistant Examiner*—Elias Desta
(74) *Attorney, Agent, or Firm*—Philip A. Pedigo

(57) ABSTRACT

Embodiments of the invention are generally directed to systems, methods, and apparatuses for the direct duty cycle calibration of a receiver clock. In some embodiments, an integrated circuit includes a receive (RX) data path, a RX clock path, and a control path. In some embodiments, the control path uses RX latches, a majority detector, and digital duty cycle control logic to calibrate the duty cycle of the clock signal. Other embodiments are described and claimed.

20 Claims, 4 Drawing Sheets

DUTY CYCLE CALIBRATION FOR RECEIVER CLOCK

TECHNICAL FIELD

Embodiments of the invention generally relate to the field of integrated circuits and, more particularly, to systems, methods and apparatuses for the duty cycle calibration of a receiver clock.

BACKGROUND

High-speed input/output (IO) circuits (e.g., those that support a double data rate, "DDR") use both the rising edge and the falling edge of a clock signal (or simply, clock) to sample data. If the clock does not have a good duty cycle, the rising edge and the falling edge of the clock cannot be properly aligned to sample data at the same time. The purpose of "receive clock duty cycle correction" is to properly align both the rising and falling edges of a clock with the data that is sampled.

Conventional IO circuits use analog detectors to perform receive clock duty cycle correction. These analog detectors typically include a differential amplifier (e.g., a front-end differential amplifier) connected with a differential clock. The output of the amplifier may be connected to an analog integrator (e.g., using a capacitor). These analog circuits typically consume a large die area. In addition, they are typically "always on" because their long settling time prohibits frequent power management of the clock distribution, which may consume a fair amount of power.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Embodiments of the invention are generally directed to systems, methods, and apparatuses for the duty cycle calibration of a receiver clock. The term "duty cycle calibration" refers to fixing a clock's duty cycle as close to 50% as needed or possible. The rising edge of the clock may be positioned near the center of the data eye using a phase interpolator (PI) and a majority detector. In some embodiments, a similar approach is used to directly position the falling edge of the clock. Unlike conventional systems which use an additional closed loop (e.g., analog circuitry) for duty cycle correction, embodiments of the invention use a majority detector and built-in duty cycle indicator ("UI" in a double pumped system) for duty cycle correction.

Figure 1:
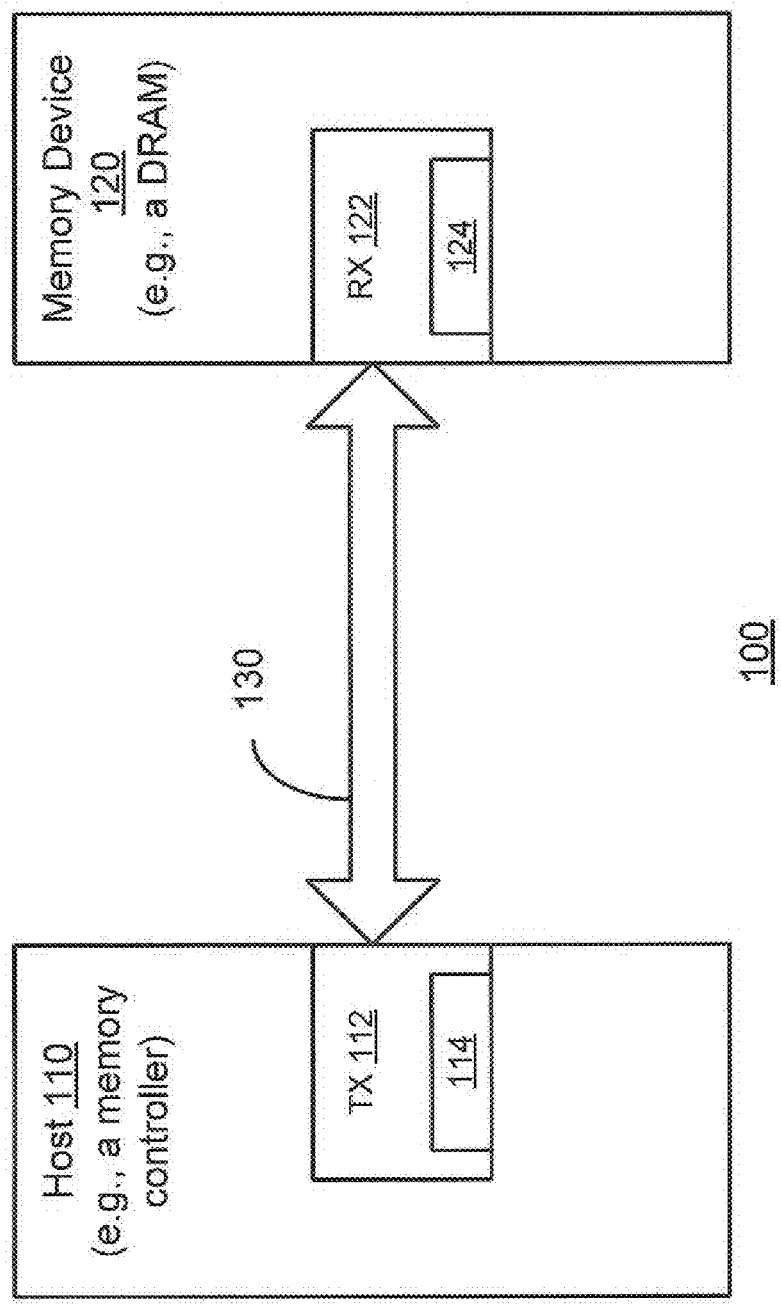
FIG. 1 is a high-level block diagram illustrating selected aspects of a computing system implemented according to an embodiment of the invention.

FIG. 1 is a high-level block diagram illustrating selected aspects of a computing system implemented according to an embodiment of the invention. In the illustrated embodiment, system 100 includes host 110 (e.g., a memory controller), memory device 120 (e.g., a dynamic random access memory device or DRAM), and memory interconnect 130. For ease of discussion, FIG. 1 only shows a single memory device 120. It is to be appreciated that system 100 may have a number of memory devices. Similarly, system 100 may include a variety of features (e.g., memory modules, connectors, etc.) that are not illustrated to facilitate discussion of embodiments of the invention. In alternative embodiments, system 100 may include more elements, fewer elements, and/or different elements.

Memory interconnect 130 may include a number of signal lines to convey data, clocks, commands, addresses, and the like. In some embodiments, interconnect 130 may be a point to point interconnect. In alternative embodiments, interconnect 130 is a multi-drop interconnect.

Host 110 controls the transfer of data to and from memory device 120. In some embodiments, host 110 is integrated onto the same die as one or more processors. In alternative embodiments, host 110 is part of a chipset for system 100.

Host 110 includes transmitter (TX) 112. Transmitter 112 may include drivers, buffers, delay locked loops, phase locked loops, and the like to transmit one or more signals to memory device 120 via interconnect 130. TX 112 may include TX duty cycle calibration logic 114 to calibrate a TX clock used to send data to a receiver (e.g., receiver 122). In some embodiments, TX duty cycle calibration logic 114 is based on an analog detector and an analog integrator.

Memory device 120 may provide (at least in part) the main system memory for system 100. Memory device 120 includes receiver (RX) 122. RX 122 may include latches, buffers, delay locked loops, phase locked loops, and the like to receive one or more signals from host 110 via interconnect 130. RX 122 includes RX duty cycle calibration logic 124 to calibrate a RX clock used to sample data received from host 110. As is further discussed below, with reference to FIGS. 2-4, logic 124 may include RX latches or flops, a majority detector, and control logic. The term "latch" broadly refers to any data sampling circuit including a latch, a flop, and the like.

Figure 2:
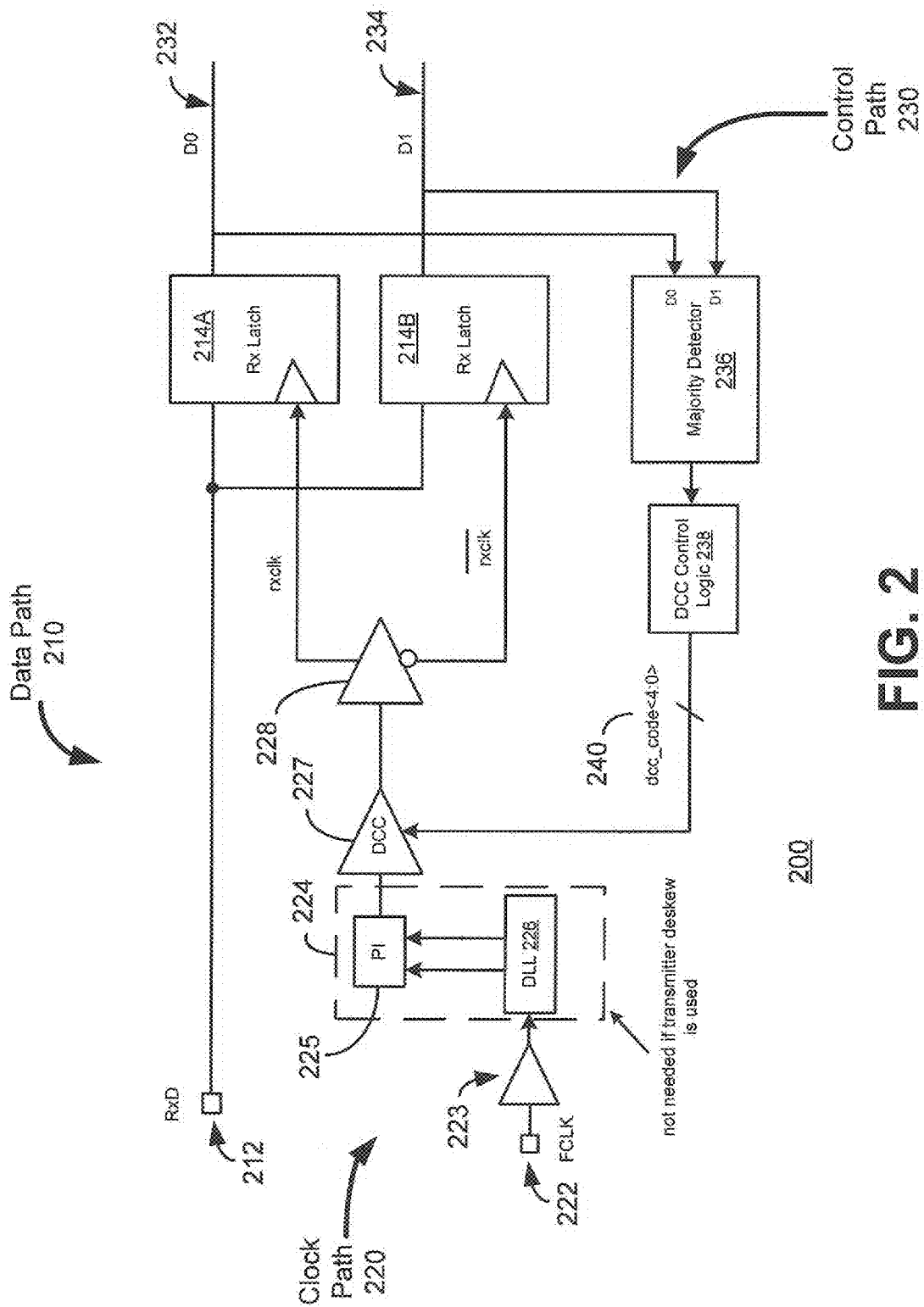
FIG. 2 is a circuit diagram illustrating selected aspects of direct duty cycle calibration according to an embodiment of the invention.

FIG. 2 is a circuit diagram illustrating selected aspects of direct duty cycle calibration according to an embodiment of the invention. RX 200 includes data path 210, clock path 220, and control path 230. In alternative embodiments, RX 200 may include more elements, fewer elements, and/or different elements.

In the illustrated embodiment, data path 210 receives data on pad 212 and provides the data as inputs to latches 214. The outputs of latches 214 provide a 1:2 deserialization of the data received on pad 212. It is to be appreciated that data path 210 may include other elements (and/or different elements) than those shown in FIG. 2. These elements, however, are not illustrated so as not to obscure the illustrated embodiment of the invention.

Clock path 220 receives a clock (e.g., FCLK) at pad 222. In some embodiments, clock amplifier 223 provides the clock to RX deskew logic 224. RX deskew logic 224 moves the edges of a clock to align the clock edges with a data eye. In some embodiments, TX deskew logic may be used to align the data to the clock edges. In such embodiments, RX deskew logic 224 is (generally) not used. In the illustrated embodiment, RX deskew logic 224 includes phase interpolator (PI) 225 and delay locked loop (DLL) 226. In alternative embodiments, RX deskew logic 224 may include more elements, fewer elements, and/or different elements.

Duty cycle corrector (DCC) 227 includes logic to manipulate (e.g., increase or decrease) the duty cycle of the RX clock. It is to be appreciated that DCC 227 may be located a little earlier or a little later in clock path 220. As is further discussed below, DCC 227 is controlled by control path 230.

The clock is branched (e.g., using buffer 228) so that a rising edge goes to latch 214A and a falling edge goes to latch 214B. In some embodiments, the clock is differential until the last stage. In alternative embodiments, the clock may remain differential. In yet other alternative embodiments, the clock may be single-ended. Also in some embodiments, the buffer 228 and DCC may be combined.

In some embodiments, control (or feedback) path 230 calibrates the RX clock duty cycle (e.g., during a training process). Control path 230 samples D0 and D1, respectively, at 232 and 234. D0 and D1 are provided as inputs to majority detector 236. In some embodiments, the depth of majority detector 236 is configurable. That is, the depth may be set to 2, 3, 4, 5, . . . , etc. The term "depth" (or length) refers to the number of samples that are collected on an input of majority detector 236. The output of majority detector 236 corresponds to the value of the majority of the samples collected at an input. For example, if the depth is set to five and three of the five samples are logical ones, then the output is a logical one. In some embodiments, the depth of majority detector 236 is set to avoid the system resonant frequency (e.g., the largest component of noise).

DCC control logic 238 determines the corrections that are made to the RX clock duty cycle. In some embodiments, control logic 238 is a state machine that implements training logic (e.g., as described in FIG. 4) that is relevant to RX 200. DCC control logic 238 receives as an input the output of majority detector 236 and provides, as an output, code 240. In some embodiments, code 240 determines the relative strengths of the buffers that control the rising and falling edges of the clock. It is to be appreciated that, in various embodiments, the actual logic implemented by DCC control logic 238 may vary considerably depending on the needs of a given RX implementation. An example of the logic implemented by DCC control logic 238 is discussed below with reference to FIGS. 3 and 4.

Figure 3:
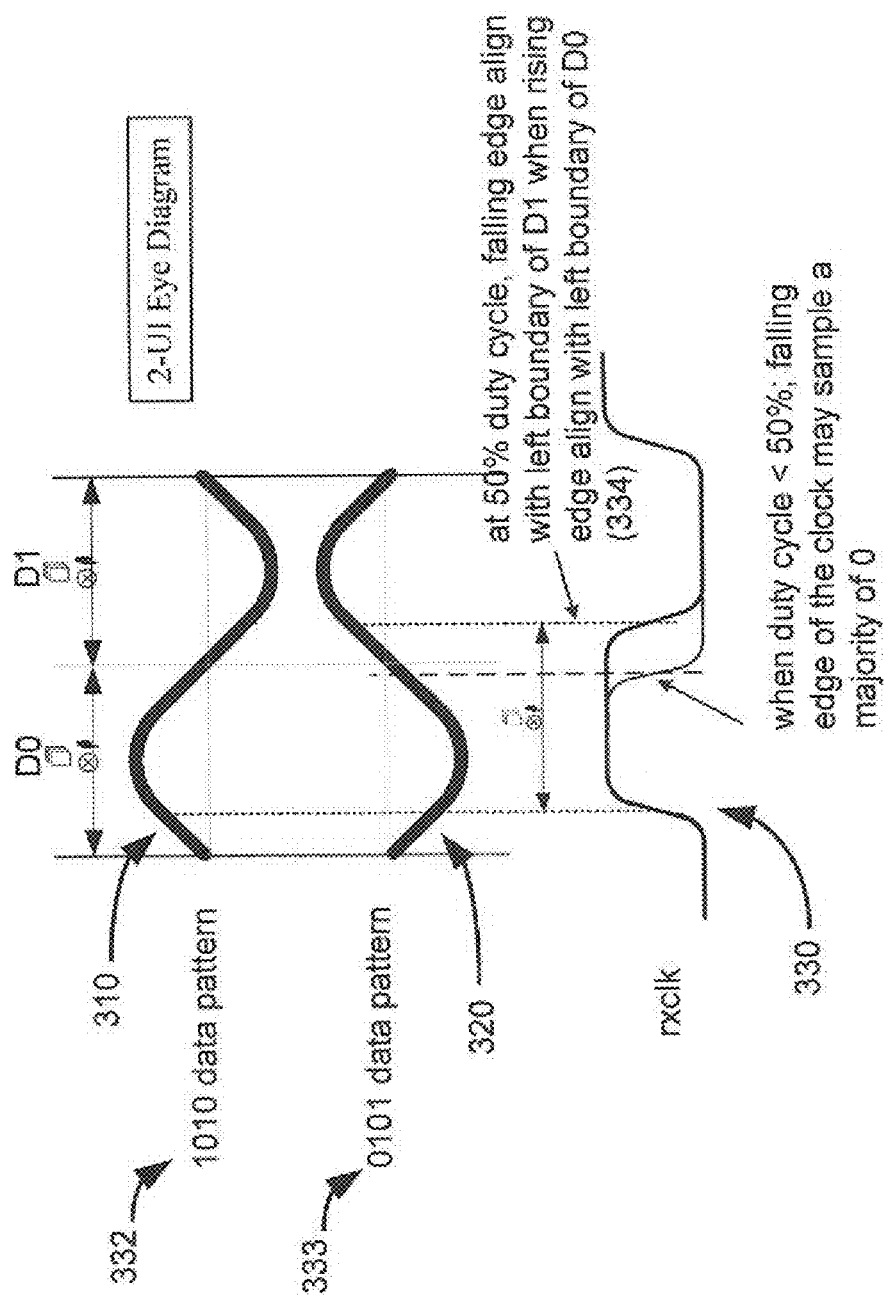
FIG. 3 is a waveform diagram illustrating selected aspects of direct duty cycle calibration according to an embodiment of the invention.

FIG. 3 is a waveform diagram illustrating selected aspects of a direct duty cycle calibration process according to an embodiment of the invention. Diagram 300 is a two unit interval (UI) eye diagram that illustrates a training process according to an embodiment of the invention. Waveform 310 illustrates the RX output (e.g., the output of RX 200, shown in FIG. 2) and the control path input, when the host transmits a 1010 training pattern. Similarly, waveform 320 illustrates the RX output and the control path input, when the host transmits a 0101 training pattern. Waveform diagram 300 is further discussed below with reference to FIG. 4.

Figure 4:
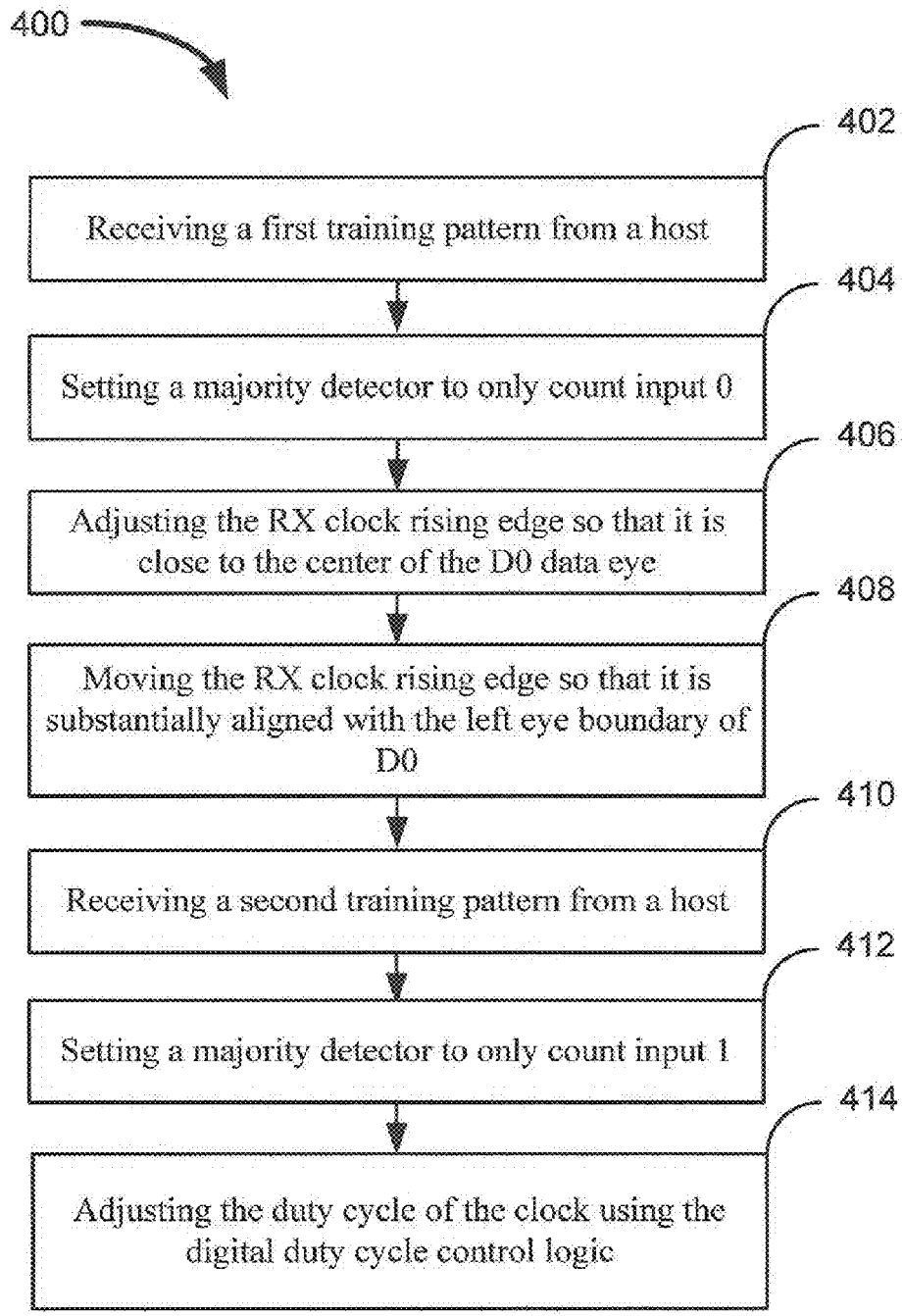
FIG. 4 is a flow diagram illustrating selected aspects of a method for direct duty cycle calibration implemented according to an embodiment of the invention.

FIG. 4 is a flow diagram illustrating selected aspects of a method for direct duty cycle calibration implemented according to an embodiment of the invention. In some embodiments, aspects of process 400 are implemented by DCC control logic (e.g., DCC control logic 238, shown in FIG. 2). Other aspects of process 400 may be implemented by other parts of a receiver (e.g., RX 200, shown in FIG. 2) and/or a transmitter (e.g., TX 112, shown in FIG. 1). Process 400 may be used to calibrate the duty cycle of a RX clock. For ease of discussion, process 400 is discussed with reference to FIG. 3 and FIG. 4.

Referring to process block 402, a receiver (RX) receives a first training pattern from a host (e.g., 332 in FIG. 3). For ease of illustration, the first training pattern is illustrated as 1010 in FIG. 3. It is to be appreciated, however, that the training pattern may vary in different implementations of the invention. A majority detector (e.g., in a control path coupled with the data path, as shown in FIG. 2) is set to count a first input (e.g., input 0) corresponding to a first output of the receiver (e.g., D0) at 404.

Referring to process block 406, the deskew logic adjusts the RX clock rising edge so that it is close (e.g., +/−30%) to the center of the D0 data eye. In some embodiments, this adjustment includes using the deskew circuit to move the rising edge so that the output of the majority detector is a consistent (logical) one. The reason for positioning the rising edge of the clock close to the center of the D0 data eye is that this location provides a convenient reference point. Once the rising edge is positioned close to the center of the D0 data eye, then moving the clock edge to the left or right will create predictable transitions (e.g., from one to zero when moving the edge to the left).

Referring to process block 408, the RX clock rising edge is moved so that it is substantially aligned with the left eye boundary of the D0 data eye. The left eye boundary refers to a left most edge of the eye at which a logical one can be correctly sampled. In some embodiments, this process element is implemented by moving the clock edge leftward (e.g., as shown by 330 in FIG. 3) until the output of the majority detector transitions from outputting a consistent one to outputting a zero. The toggling of the output indicates that the clock edge is (substantially) at the left eye boundary of the D0 data eye. Thus, the rising edge of the clock is calibrated and the training process continues with calibrating the location of the falling edge (and, thereby, calibrating the duty cycle of the clock).

Referring to process block 410, the RX receives a second training pattern from a host (e.g., 333 in FIG. 3). In some embodiments, the second training pattern is the inverse of the first training pattern. For example, if the first training pattern is 1010, then the second training pattern may be 0101. It is to be appreciated, however, that the training pattern may vary in different implementations of the invention. The majority detector (e.g., in a control path coupled with the data path, as shown in FIG. 2) is set to count a second input (e.g., input 1) corresponding to a second output of the receiver (e.g., D1) at 412.

Referring to process block 414, the falling edge of the clock is adjusted to calibrate the duty cycle of the clock. Ideally, if the duty cycle of the clock is 50% then, when the training pattern is inverted after the rising edge is aligned to left boundary of D0 data eye, the falling edge of the clock should be aligned with the left boundary of the D1 data eye. This would cause the output of the majority detector to alternate between ones and zeros. If the duty cycle of the clock is not close to 50%, the output of the majority detector may be a consistent one or a consistent zero. In practice, however, the falling edge of the clock will likely need to be shifted to complete the calibration of the duty cycle, so the falling edge position relative to the left eye boundary of D1 is substantially the same as the rising edge position relative to left eye boundary of D0. In some embodiments, the falling edge is first shifted to the right by enlarging the duty cycle until the majority detector outputs consistent one (unless it is already so). Then in some embodiments, the falling edge is shifted to the left by reducing the duty cycle (e.g., in small steps as illustrated by 334 in FIG. 3) until majority detector output transitions from a one to a zero. In some embodiments, the calibration of the duty cycle is complete once the falling edge of the clock is substantially aligned with left eye boundary of D1. The deskew logic can then re-position both the rising and the falling edges of the clock to the center of data eyes.

The training method described in FIG. 4 does not make assumptions about the waveform. That is, asymmetry of the waveform does not impact the training because the waveform is merely shifted during the training process.

In some embodiments, the TX clock should be duty cycle corrected (e.g., by logic 114, shown in FIG. 1) before the above-described training process is performed. Otherwise, its residual duty cycle error may be translated into the RX clock duty cycle error. This error, however, is on par with residual duty cycle error achievable by the traditional DCC circuit (assuming the TX and RX chips have similar performance).

The digital nature of the above-described duty calibration circuit and method supports faster recovery time because conventional analog detectors take a longer time to settle. In addition, the above-described solution involves a smaller die area and lower power consumption when compared with the traditional analog approach. The reason for this is that the traditional analog approach uses large duty cycle detectors which increase the loading and the power to the clock signal whose duty cycle is corrected.

Elements of embodiments of the present invention may also be provided as a machine-readable medium for storing the machine-executable instructions. The machine-readable medium may include, but is not limited to, flash memory, optical disks, compact disks-read only memory (CD-ROM), digital versatile/video disks (DVD) ROM, random access memory (RAM), erasable programmable read-only memory (EPROM), electrically erasable programmable read-only memory (EEPROM), magnetic or optical cards, propagation media or other type of machine-readable media suitable for storing electronic instructions. For example, embodiments of the invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the description above, certain terminology is used to describe embodiments of the invention. For example, the term "logic" is representative of hardware, firmware, software (or any combination thereof) to perform one or more functions. For instance, examples of "hardware" include, but are not limited to, an integrated circuit, a finite state machine, or even combinatorial logic. The integrated circuit may take the form of a processor such as a microprocessor, an application specific integrated circuit, a digital signal processor, a microcontroller, or the like.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of embodiments of the invention, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed subject matter requires more features than are expressly recited in each claim. Rather, as the following claims reflect, inventive aspects lie in less than all features of a single foregoing disclosed embodiment. Thus, the claims following the detailed description are hereby expressly incorporated into this detailed description.

What is claimed is:

1. An integrated circuit comprising:
    a receive (RX) data path to receive a data signal and to provide the data signal to a first RX latch and a second RX latch;
    a RX clock path to provide a clock signal, the clock signal having a rising edge and a falling edge, wherein the rising edge is to trigger the first RX latch and the falling edge is to trigger the second RX latch; and
    a control path to control a duty cycle of the clock signal, the control path including,
    a majority detector having a first input coupled with an output of the first RX latch and a second input coupled with an output of the second RX latch, digital duty cycle control logic to calibrate the duty cycle of the clock signal based, at least in part, on an output of the majority detector.

2. The integrated circuit of claim 1, wherein the majority detector is set to count the first input if the RX data path receives a first clock pattern.

3. The integrated circuit of claim 2, further comprising deskew logic, wherein the deskew logic includes logic to adjust the rising edge so that it is approximately aligned with a center of a first data eye.

4. The integrated circuit of claim 3, wherein the deskew logic further includes
    logic to substantially align the rising edge with the left eye boundary of the first data eye.

5. The integrated circuit of claim 4, wherein the majority detector is set to count the second input if the RX data path receives a second clock pattern.

6. The integrated circuit of claim 5, wherein the digital duty cycle control logic includes logic to adjust the falling edge so that it is approximately aligned with a left boundary of a second data eye.

7. The integrated circuit of claim 1, wherein the integrated circuit comprises a dynamic random access memory device.

8. A method comprising:
    receiving a first clock pattern on a clock path, wherein the clock path provides a rising edge to a first latch and a falling edge to a second latch, and further wherein a control path is coupled with the clock path, the control path including a majority detector having a first input coupled with an output of the first latch and a second input coupled with an output of the second latch;
    setting a majority detector to count an input received at the first input;
    adjusting the rising edge so that it is approximately aligned with a center of a first data eye;
    aligning the rising edge with a left eye boundary of the first data eye;
    receiving a second clock pattern on the clock path;
    setting the majority detector to count an input received at the second input; and
    adjusting the falling edge so that it is approximately aligned with a left boundary of a second data eye.

9. The method of claim 8, wherein adjusting the rising edge so that it is approximately aligned with a center of a first data eye comprises:
    adjusting the rising edge so that an output of the majority detector is a consistent logical one.

10. The method of claim 8, wherein aligning the rising edge with a left eye boundary of the first data eye comprises:
adjusting the rising edge so that the majority detector transitions from outputting a consistent logical one to outputting a logical zero.

11. The method of claim 8, wherein adjusting the falling edge so that it is approximately aligned with a left boundary of a second data eye comprises:
reducing the duty cycle, if an output of the majority detector is a consistent logical one.

12. The method of claim 8, wherein adjusting the falling edge so that it is approximately aligned with a left boundary of a second data eye comprises:
increasing the duty cycle then reducing it, if an output of the majority detector is not a consistent logical one.

13. A system comprising:
a first integrated circuit; and
a second integrated circuit coupled with the first integrated circuit, the second integrated circuit including,
a receive (RX) data path to receive a data signal and to provide the data signal to a first RX latch and a second RX latch,
a RX clock path to provide a clock signal, the clock signal having a rising edge and a falling edge, wherein the rising edge is to trigger the first RX latch and the falling edge is to trigger the second RX latch, and
a control path to control a duty cycle of the clock signal, the control path including,
a majority detector having a first input coupled with an output of the first RX latch and a second input coupled with an output of the second RX latch, and
digital duty cycle control logic to calibrate the duty cycle of the clock signal based, at least in part, on an output of the majority detector.

14. The system of claim 13, wherein the majority detector is set to count the first input if the RX data path receives a first clock pattern.

15. The system of claim 14, wherein the second integrated circuit further comprises deskew logic, the deskew logic including logic to adjust the rising edge so that it is approximately aligned with a center of a first data eye.

16. The system of claim 15, wherein the deskew logic further includes logic to substantially align the rising edge with the left eye boundary of the first data eye.

17. The system of claim 16, wherein the majority detector is set to count the second input if the RX data path receives a second clock pattern.

18. The system of claim 17, wherein the digital duty cycle control logic includes logic to adjust the falling edge so that it is approximately aligned with a left boundary of a second data eye.

19. The system of claim 13, wherein the first integrated circuit comprises a memory controller.

20. The system of claim 13, wherein the second integrated circuit comprises a dynamic random access memory device.

* * * * *